United States Patent

Ahmad et al.

[11] Patent Number: 5,849,615
[45] Date of Patent: Dec. 15, 1998

[54] SEMICONDUCTOR PROCESSING METHOD OF FABRICATING FIELD EFFECT TRANSISTORS

[75] Inventors: Aftab Ahmad; Kirk Prall, both of Boise, Id.

[73] Assignee: Micron Technology, Inc., Boise, Id.

[21] Appl. No.: 604,904

[22] Filed: Feb. 22, 1996

[51] Int. Cl.$^6$ ............................................... H01L 21/8238
[52] U.S. Cl. .......................... 438/231; 438/232; 438/302
[58] Field of Search .................................... 438/229, 230, 438/231, 232, 302, 168, 169, 204

[56] References Cited

U.S. PATENT DOCUMENTS

| 5,147,811 | 9/1992 | Skagami | 438/302 |
| 5,217,910 | 6/1993 | Shimizu et al. | 438/231 |
| 5,401,994 | 3/1995 | Adan | 257/335 |
| 5,500,379 | 3/1996 | Odake et al. | 438/232 |
| 5,614,432 | 3/1997 | Goto | 438/231 |

FOREIGN PATENT DOCUMENTS

| 0-298023 | 10/1990 | Japan | 438/204 |

OTHER PUBLICATIONS

D. Jung et. al., "A 0.25μm CMOSFET Using Halo Implantation for 1Gb DRAM", Extended Abstracts of the 1995 International Conference on Solid State Devices and Materials, Osaka, published, Sep. 1995, pp. 869–871.

Primary Examiner—Michael Trinh
Attorney, Agent, or Firm—Wells, St. John, Roberts, Gregory & Matkin, P.S.

[57] ABSTRACT

In one aspect of the invention, a semiconductor processing method includes: a) providing a semiconductor substrate; b) defining a first conductivity type region and a second conductivity type region of the semiconductor substrate; c) providing a first transistor gate over the first type region which defines a first source area and a first drain area operatively adjacent thereto; d) providing a second transistor gate over the second type region which defines a second source area and a second drain area operatively adjacent thereto; and e) blanket implanting a conductivity enhancing dopant of the second conductivity type through the first source and drain areas of the first conductivity region and the second source and drain areas of the second conductivity region to provide second conductivity type regular LDD implant regions within the substrate operatively adjacent the first transistor gate and to provide second conductivity type halo implant regions within the substrate operatively adjacent the second transistor gate. In another aspect, a semiconductor processing method includes: a) providing a semiconductor substrate; b) providing a transistor gate over the semiconductor substrate; c) providing spacers adjacent the transistor gate; d) providing electrically conductive source and drain implant regions within the substrate operatively adjacent the transistor gate; e) implanting a conductivity enhancing dopant into the previously formed electrically conductive source and drain regions; and f) driving the conductivity enhancing dopant under the spacers to form graded junction regions.

5 Claims, 6 Drawing Sheets

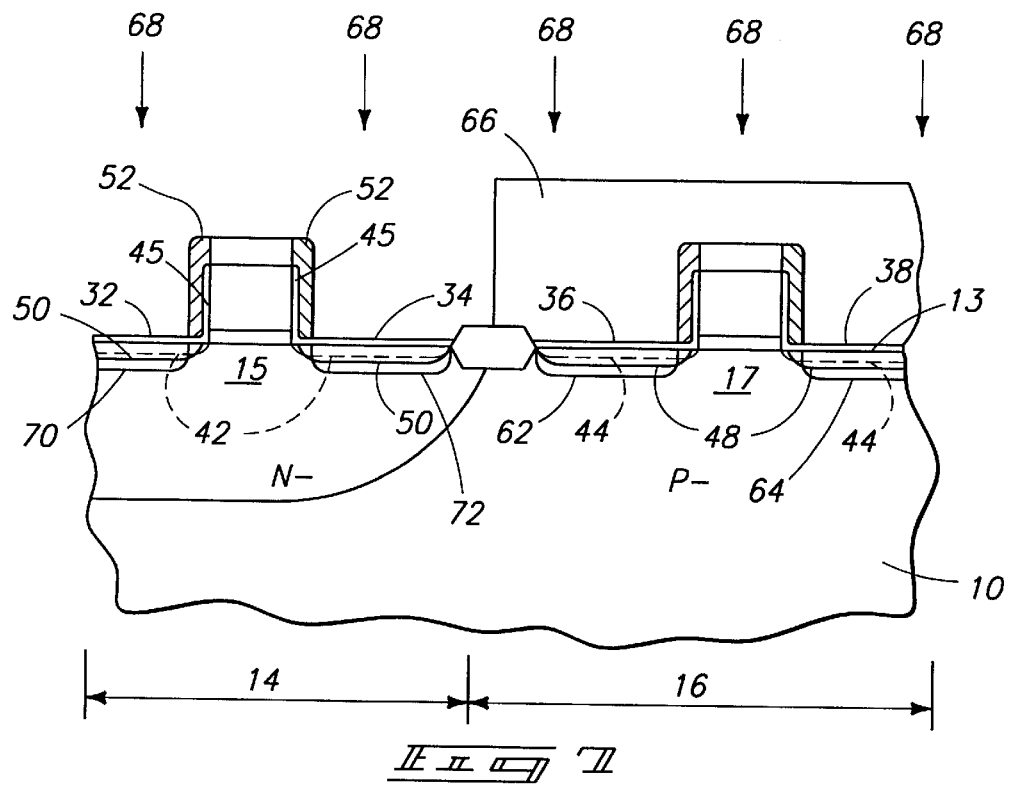
_Fig. 7_
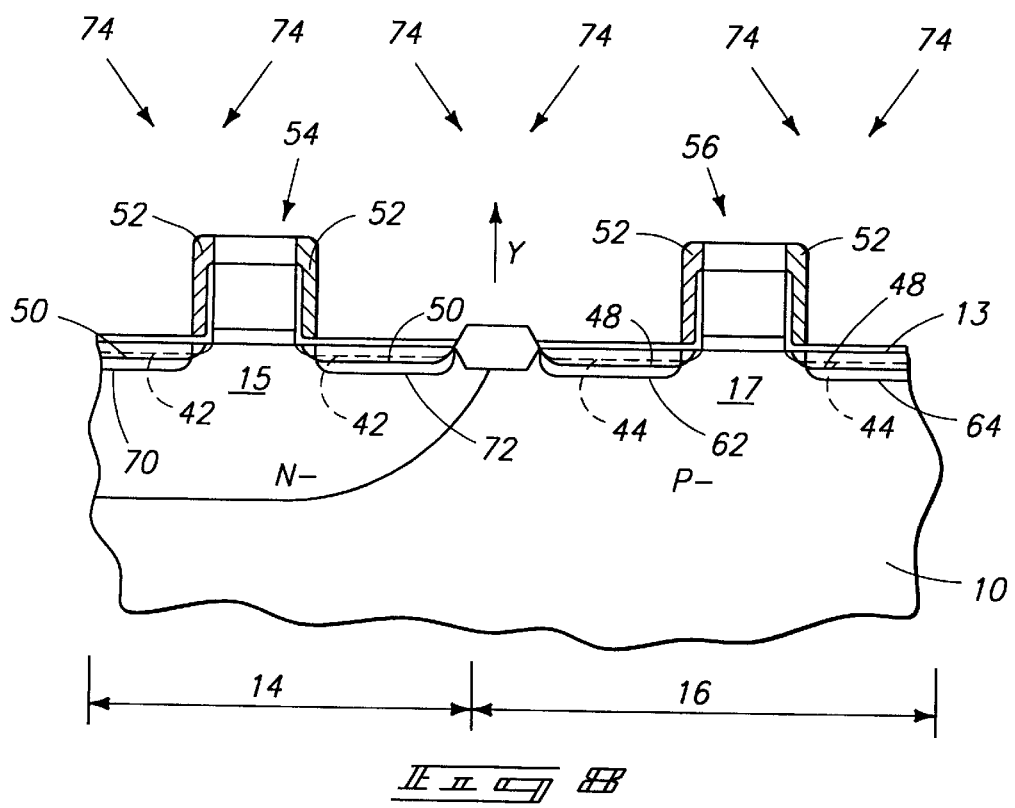
_Fig. 8_

SEMICONDUCTOR PROCESSING METHOD OF FABRICATING FIELD EFFECT TRANSISTORS

TECHNICAL FIELD

This invention relates to methods of forming semiconductor transistors and to the transistors themselves. More specifically, the invention relates to methods of forming N-channel Metal-Oxide Semiconductor field effect transistors (NMOS), P-channel Metal-Oxide Semiconductor field effect transistors (PMCS), Complementary NMOS and PMOS type field effect transistors (CMOS), and to field effect transistors formed by such methods.

BACKGROUND OF THE INVENTION

This invention grew out of a need to improve the methods of semiconductor device miniaturization and to thereby enhance production of very efficient integrated circuitry. The methods of this invention are particularly adapted to the problems confronted in ultra large scale integration (ULSI) and the production of transistors in the sub-half-micron regime. However, practitioners skilled in the art will also appreciate that the methods of this invention can be applied to very large scale integration (VLSI) and the production of transistors in the micron regime.

Among the problems that become particularly pronounced as transistor size decreases are source-drain punch through and hot electron susceptibility. These problems are commonly solved by forming graded junction regions to decrease the abruptness of the transition from a conductively doped source or drain region to the bulk substrate surrounding the region.

There are numerous types of graded junction regions. Two commonly used graded junction regions are the regular Lightly Doped Drain (LDD) region and the halo region.

The regular LDD regions are often utilized to reduce the electric field under a gate and to thereby reduce the energy of hot electrons within a Metal-Oxide Semiconductor Field Effect Transistor (MOSFET) device. This reduction in energy can reduce the damage caused to the MOSFET device by such hot electrons. The regular LDD regions comprise a conductivity enhancing dopant of the same conductivity type as the adjacent source or drain regions. Thus, in an NMOS device the regular LDD regions comprise an n-type conductivity enhancing dopant, and in a PMOS device the regular LDD regions comprise a p-type conductivity enhancing dopant.

Halo regions are commonly used to improve the punch-through resistance of a transistor. Halo regions comprise conductivity enhancing dopant of a different conductivity type than the source or drain regions adjacent the halo region. Thus, in an NMOS device the halo regions comprise a p-type conductivity enhancing dopant, and in a PMOS device the halo regions comprise an n-type conductivity enhancing dopant.

A significant problem encountered in the formation of graded junction regions arises from the additional masking steps used in forming these regions. Each additional masking step carries with it a risk of error due to mask misalignment. Accordingly, the probability of creating a fully functional, high-quality integrated circuit decreases as a function of the number of additional masking steps required to form the circuit. It is an object of this invention to reduce the number of masking steps used for graded junction formation during transistor fabrication generally, and during CMOS fabrication specifically.

In one aspect, this invention teaches a method of simultaneously forming regular LDD and halo regions for paired NMOS and PMOS devices of CMOS circuitry. In another aspect, this invention teaches a method for enhancing the dopant concentration of regular LDD regions and/or halo regions after the formation of a gate and the provision of spacers and/or source/drain regions adjacent to the gate.

BRIEF DESCRIPTION OF THE DRAWINGS

Preferred embodiments of the invention are described below with reference to the following drawings.

FIG. 7 is a view of the FIG. 1 wafer shown at a step subsequent to that of FIG. 6.

FIG. 8 is a view of the FIG. 1 wafer shown at a step subsequent to that of FIG. 7.

DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming complementary NMOS and PMOS type field effect transistors on a substrate includes:

providing a semiconductor substrate;

defining a first conductivity type region and a second conductivity type region of the semiconductor substrate, one of the first and second regions being an n-type region and the other region being a p-type region;

providing a first transistor gate over the first conductivity type region, the first transistor gate defining a first source area and a first drain area operatively adjacent the first transistor gate;

providing a second transistor gate over the second conductivity type region, the second transistor gate defining a second source area and a second drain area operatively adjacent the second transistor gate; and after providing the first and second transistor gates, blanket implanting a conductivity enhancing dopant of the second conductivity type through the first source and drain areas of the first conductivity region and the second source and drain areas of the second conductivity region to provide second conductivity type regular LDD implant regions within the substrate operatively adjacent the first transistor gate and to provide second conductivity type halo implant regions within the substrate operatively adjacent the second transistor gate.

In accordance with another aspect of the invention, a semiconductor processing method of forming field effect transistors on a substrate includes:

providing a semiconductor substrate, the substrate comprising an overall planar global configuration, the planar global configuration establishing a virtual planar top surface and an axis normal to the virtual planar top surface;

providing a transistor gate over the semiconductor substrate;

first implanting a first conductivity enhancing dopant impurity into the substrate operatively adjacent the transistor gate to a concentration effective to form electrically conductive source and drain implant regions; and after forming the electrically conductive source and drain implant regions, second implanting a second conductivity enhancing dopant impurity at an angle other than parallel to the axis normal to the virtual planar top surface of the substrate to form graded junction regions inwardly adjacent the electrically conductive source and drain implant regions.

Figure 1:
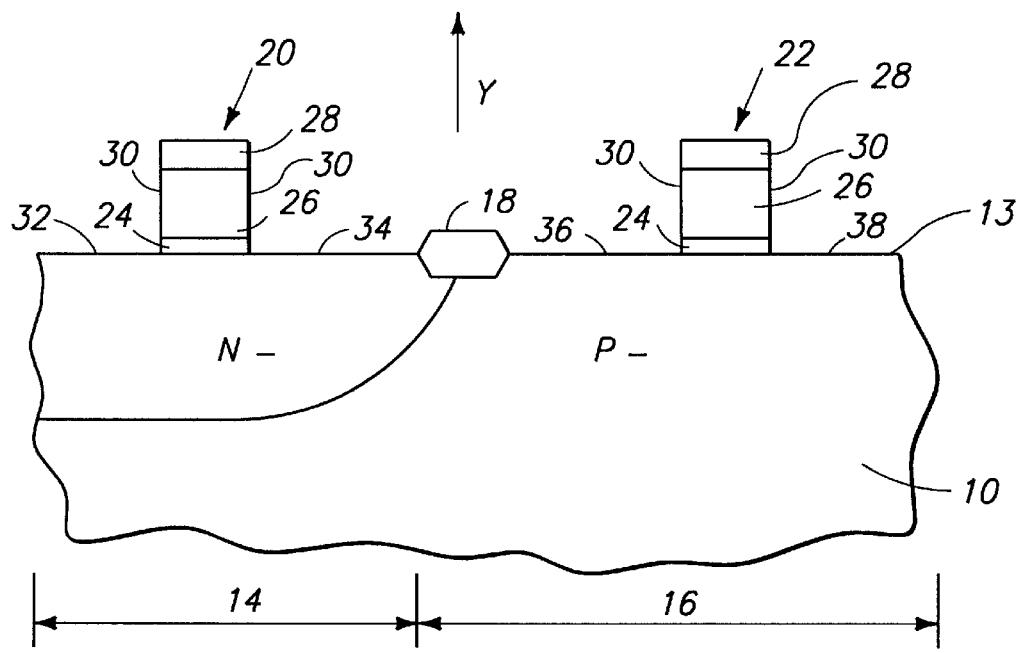
FIG. 1 is a diagrammatic fragmentary sectional view of a semiconductor wafer fragment at one processing step in accordance with one embodiment of the invention.
Figure 11:
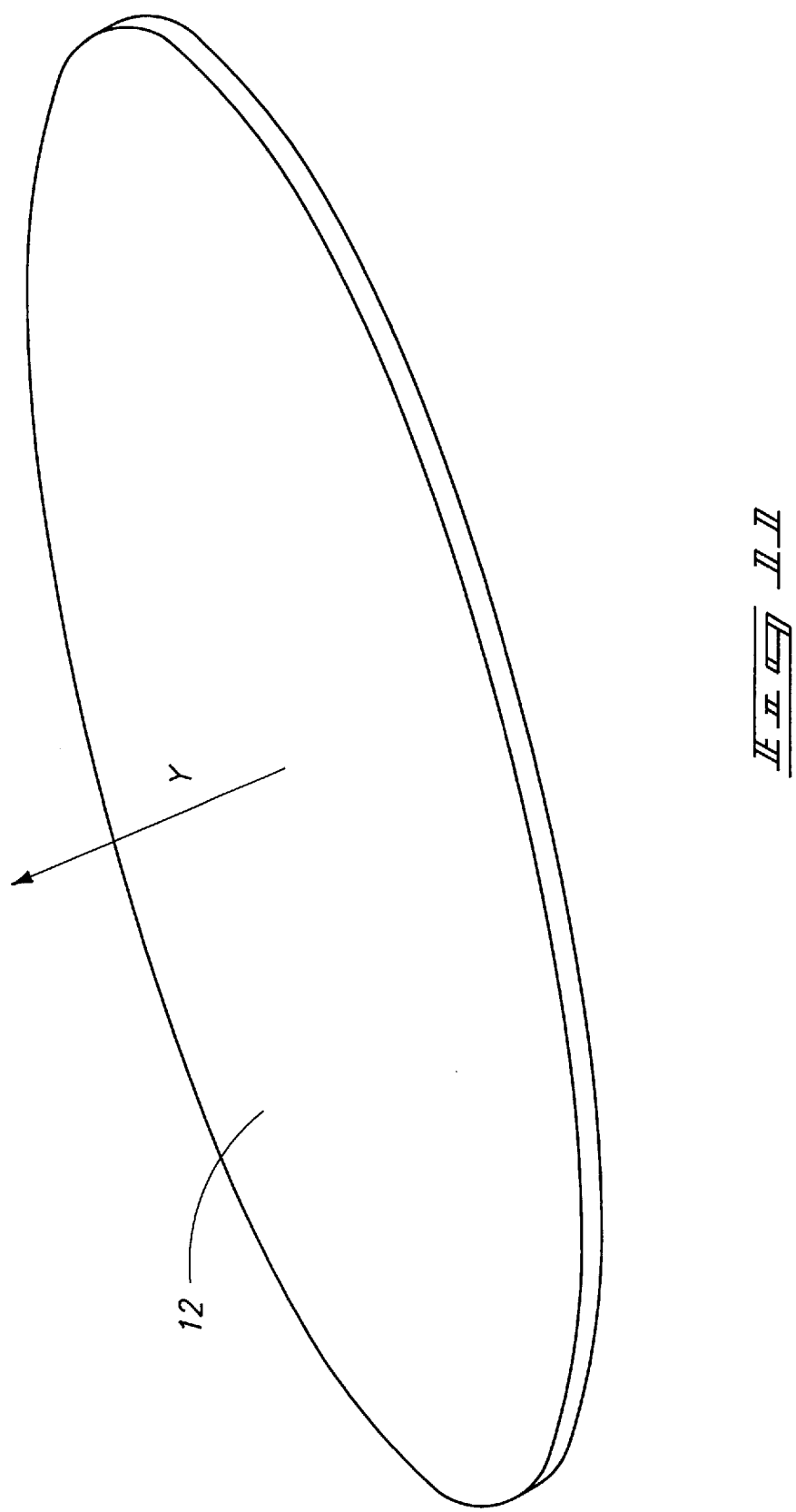
FIG. 11 is an isometric view of a semiconductor wafer.

More specifically and first with reference to FIG. 1, the method of the present invention generally includes provision of a semiconductor substrate 10. Substrate 10, when viewed from a distance (shown in FIG. 11) has an overall planar global configuration which establishes a virtual planar top surface 12 and an axis "Y" normal to virtual planar top surface 12. It is to be understood that virtual planar top surface 12 is an imaginary surface. The virtual surface 12 is defined as the apparently flat surface of a semiconductor wafer which appears when the wafer is viewed from a distance. Thus, virtual surface 12 exists regardless of whether the actual local top surface 13 (shown in FIG. 1) of substrate 10 contains crevices or protrusions, such as would result from prior semiconductor processing steps.

An n-type region 14 and a p-type region 16 are provided relative to substrate 10 and are separated by a field oxide 18. Transistor gates 20 and 22 are provided over n-type region 14 and p-type region 16, respectively. Gate 20 ultimately defines the gate region of a PMOS transistor 54 (shown in FIG. 8) and gate 22 ultimately defines the gate region of an NMOS transistor 56 (shown in FIG. 8). As regions 14 and 16 ultimately comprise PMOS and NMOS transistors, the regions may also be referred to as PMOS region 14 and NMOS region 16. Gates 20 and 22 each comprise a gate oxide layer 24, a conductive region 26 and a cap layer 28. Preferably, conductive region 26 will comprise polysilicon and cap layer 28 will comprise silicon nitride. Gates 20 and 22 further comprise sidewalls 30 extending along their outer lateral surfaces. As shown in the figure, sidewalls 30 are generally substantially parallel to the axis "Y".

Also, gates 20 and 22 define source and drain areas operatively adjacent to them. Specifically, gate 20 defines PMOS source area 32 and drain area 34, while gate 22 defines NMOS source area 36 and drain area 38. The gates 20 and 22 further define channel regions 15 and 17 (shown in FIGS. 3–8) below them.

Figure 2:
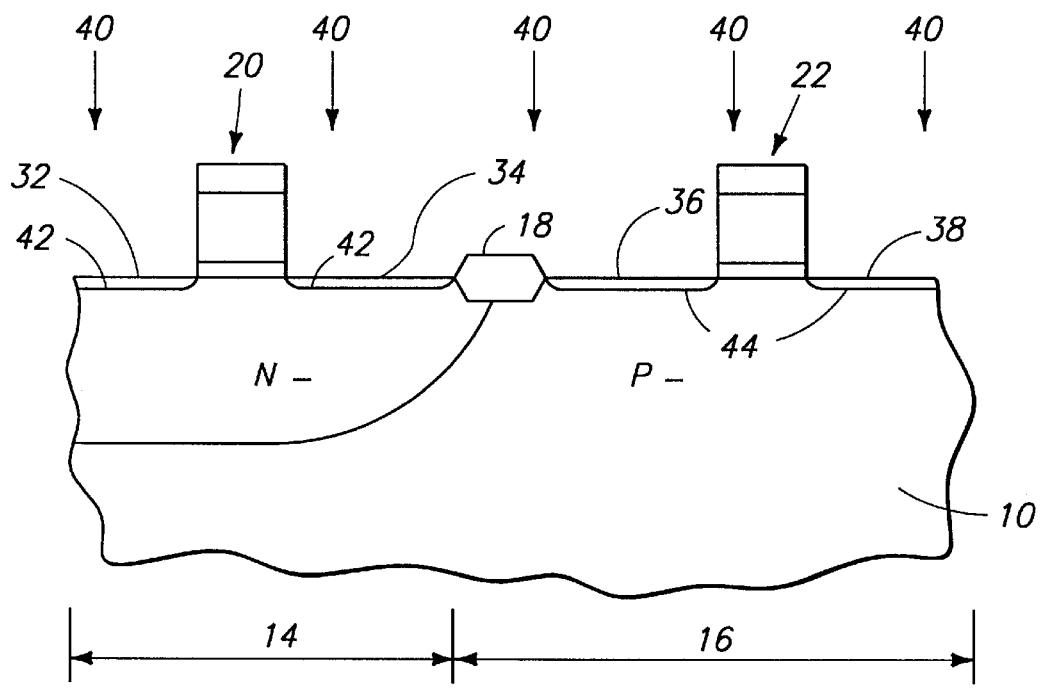
FIG. 2 is a view of the FIG. 1 wafer shown at a processing step subsequent to that shown in FIG. 1.

Referring to FIG. 2, a conductivity enhancing dopant 40 is blanket implanted through source and drain areas 32, 34, 36 and 38 to form regular LDD regions and halo regions. In the discussion that follows, dopant 40 is referred to as an n-type dopant, such as phosphorus or arsenic. However, it is to be understood that dopant 40 could also be a p-type dopant, such as $BF_2$, as discussed more fully below. The implant of n-type dopant 40 provides n-type halo implant regions 42 within substrate 10 operatively adjacent PMOS gate 20, and provides n-type regular LDD regions 44 within substrate 10 operatively adjacent NMOS gate 22. Preferably, n-type dopant 40 will be arsenic, and will be implanted at a dose of from about $5\times10^{12}$ atoms/cm$^2$ to about $5\times10^{13}$ atoms/cm$^2$ and at an energy of from about 10 KeV to about 100 KeV.

Figure 3:
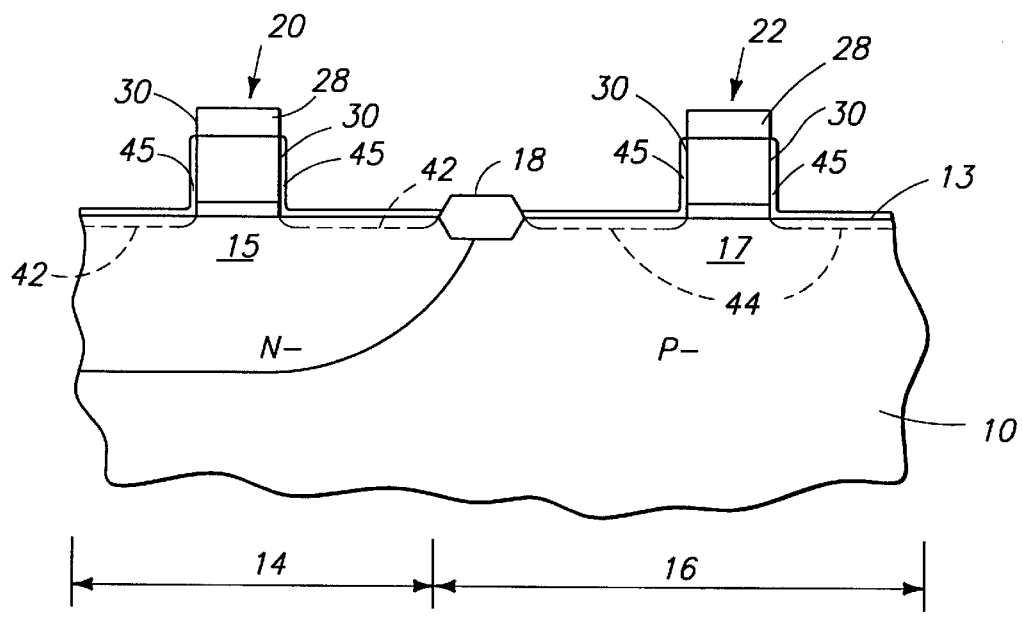
FIG. 3 is a view of the FIG. 1 wafer shown at a processing step subsequent to that of FIG. 2.

Referring to FIG. 3, sidewalls 30 and top surface 13 are oxidized to form a thin layer of oxide 45 which extends along gate sidewalls 30 and which further extends across top surface 13 of substrate 10. Oxide layer 45 is preferably from about 150 Angstroms to about 300 Angstroms thick. Methods for such oxide layer formation are known to persons of ordinary skill in the art of semiconductor processing.

The sidewall oxidation is conducted for conventional purposes, such as, rounding gate oxide corners (not shown) and relaxing the electric field beneath gate sidewall edges 30. The sidewall oxidation is also conducted to subject substrate 10 to heating and to thereby facilitate diffusion of graded junction regions 42 and 44. Preferably, such heating diffuses the graded junction regions inwardly, toward channel regions 15 and 17. Such heating also preferably diffuses the graded junction regions downwardly, deeper within substrate 10. Thus, regions 42 and 44 are shown as diffuse and expanded after the formation of oxide layer 45 (FIG. 3), relative to prior to formation of oxide layer 45 (FIG. 2). The inward and downward diffusion of the graded junction regions can improve the characteristics of a device formed by the method of the present invention. For instance, the inward and downward diffusion of the halo regions 42 can improve the short channel characteristics, while the inward and downward diffusion of the regular LDD regions 44 can improve the transistor drive and reduce the substrate current.

Figure 4:
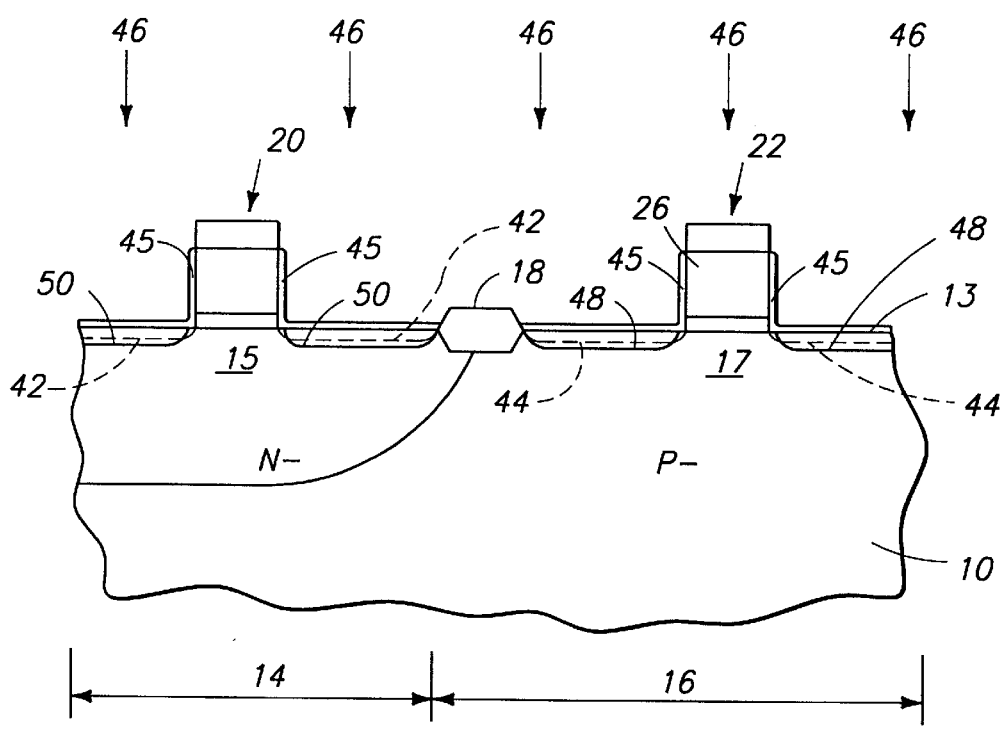
FIG. 4 is a view of the FIG. 1 wafer shown at a processing step subsequent to that of FIG. 3.

Referring to FIG. 4, a second blanket implant of a conductivity enhancing dopant 46 may be provided. Dopant 46 is a preferably a p-type impurity, and forms p-type halo regions 48 within substrate 10 operatively adjacent NMOS gate 22, and p-type regular LDD regions 50 within substrate 10 operatively adjacent PMOS gate 20. Preferably, p-type dopant 46 will comprise boron. Most preferably, p-type dopant 46 will be $BF_2$ and will be implanted at a dose of from about $5\times10^{12}$ atoms/cm$^2$ to about $5\times10^{13}$ atoms/cm$^2$ and at an energy of from about 10 KeV to about 100 KeV.

As implanted, regions 48 and 50 are displaced from gates 20 and 22 by the width of oxide layer 45. Thus, the most inward edges of regions 48 and 50, i.e., the edges nearest to channels 15 and 17, are displaced from channels 15 and 17 relative to the most inward edges of regions 42 and 44. Regions 48 and 50 may be implanted at an energy such that these regions are less deep within substrate 10 than are the diffused regions 42 and 44, equally deep as diffused regions 42 and 44, or more deep than diffused regions 42 and 44, depending on the circuitry characteristics desired.

Figure 5:
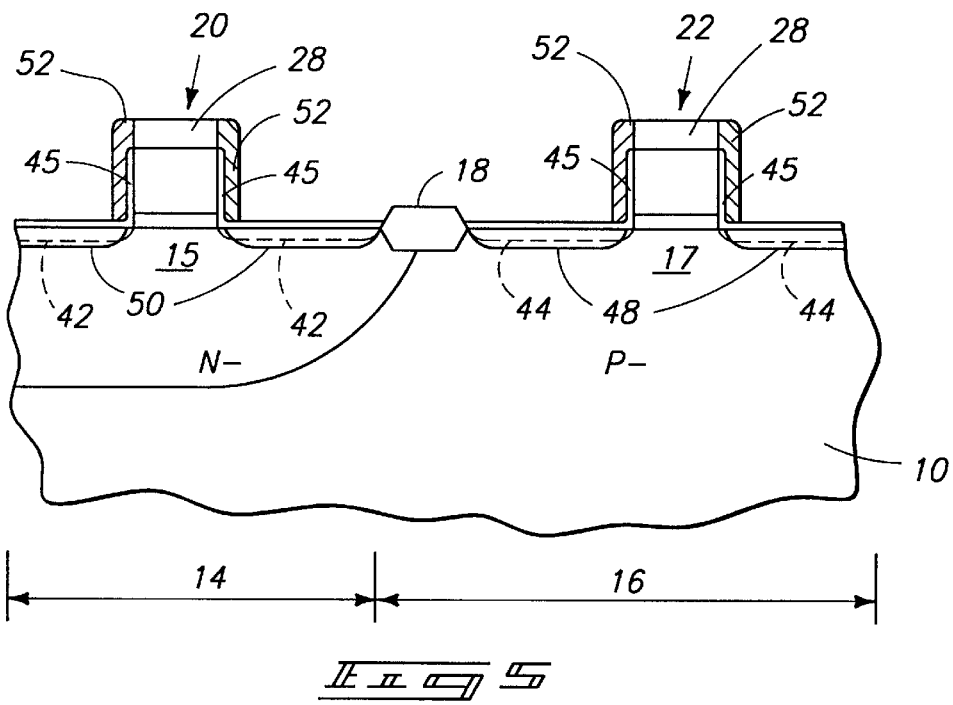
FIG. 5 is a view of the FIG. 1 wafer shown at a step subsequent to that of FIG. 4.

Referring to FIG. 5, sidewall spacers 52 are provided over oxide layer 45 and adjacent to cap layer 28. Sidewall spacers 52 preferably comprise an electrically insulative material, and most preferably comprise silicon nitride or silicon dioxide. Also, spacers 52 preferably extend outward from cap 28 at a maximum width of from about 300 Angstroms to about 1000 Angstroms, and preferably comprise rounded outer corners as shown.

Figure 6:
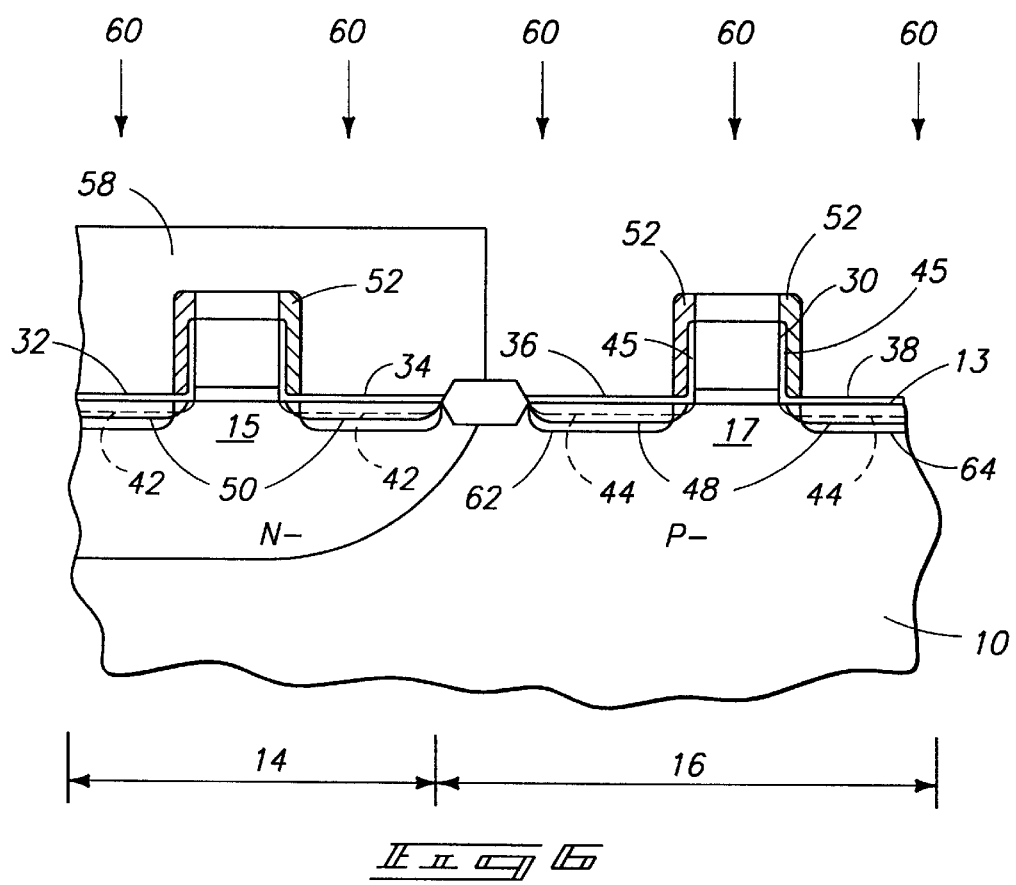
FIG. 6 is a view of the FIG. 1 wafer shown at a step subsequent to that of FIG. 5.

Referring to FIG. 6, a mask 58 (preferably of photoresist) is provided over source and drain areas 32 and 34, and preferably over the entire n-type region 14. An n-type dopant 60 is then implanted through NMOS source and drain areas 36 and 38 to form NMOS source and drain regions 62 and 64. Preferably, n-type dopant 60 is arsenic and is implanted at a dose of from about $1 \times 10^{15}$ to about $4 \times 10^{15}$ and at an energy of from about 10 KeV to about 50 KeV. Most preferably, the implanting of n-type dopant 60 comprises two implanting steps. The first implanting step is the arsenic implant described above, and the second implanting step is a phosphorus implant at a dose of from about $1 \times 10^{12}$ to about $5 \times 10^{13}$ and an energy of from about 30 KeV to about 70 KeV. The phosphorus implant can increase transistor drive for peripheral NMOS field effect transistors, which are not shown. Source and drain implant regions 62 and 64 are displaced from channel 17 by the combined widths of spacers 52 and oxide layer 45. This combined width will preferably be from approximately 450 Angstroms to approximately 1300 Angstroms. As shown, the preferred embodiment forms source and drain regions 62 and 64 which are separated from a channel 17 by a series of graded junctions. Such graded junctions comprise an interior portion of regular LDD region 44 and an interior portion of halo region 48.

Referring to FIG. 7, mask 58 is stripped from p-type region 16, and a second mask 66 (preferably of photoresist) is applied over NMOS source and drain areas 36 and 38, and preferably over the entire p-type region 16. Then, a p-type dopant 68 is implanted through PMOS source and drain areas 32 and 34 to form PMOS source and drain implant regions 70 and 72. P-type dopant 68 preferably comprises $BF_2$ implanted at a dosage of from about $1 \times 10^{15}$ atoms/cm$^2$ to about $5 \times 10^{15}$ atoms/cm$^2$ and at an energy of from about 10 KeV 40 KeV. Source and drain implant regions 70 and 72 are displaced from channel 15 by about a sum of the width of oxide layer 45 and the width of spacers 52. As discussed above, this width will preferably be from approximately 450 Angstroms to approximately 1300 Angstroms, Referring to FIG. 8, mask 66 is stripped, thus revealing CMOS circuitry comprising a PMOS transistor 54 and an NMOS transistor 56. FIG. 8 also shows a further embodiment of the present invention in which a conductivity enhancing dopant 74 is implanted at an angle other than parallel to the axis "Y" normal to the virtual planar surface 12 of substrate 10. Such an implant can increase the dopant concentration in one or more of the graded junction regions below spacers 52 or beneath one or more of the gates 20 and 22.

The dopant 74 may be either an n-type dopant or a p-type dopant. If dopant 74 is an n-type dopant, then the shown angled implant of dopant 74 enhances the conductivity of regular LDD regions 44 and of halo regions 42. If dopant 74 is p-type, then the angled implant enhances the conductivity of regular LDD regions 50 and halo regions 48.

The FIG. 8 embodiment for enhancing dopant concentration in graded junction regions 42, 44, 48 and 50 effectively comprises two consecutive stages. First, conductivity enhancing dopant 74 is implanted into source and drain regions 32, 34, 36 and 38, and possibly into spacers 52. Second, conductivity enhancing dopant 74 is driven under spacers 52 and into the graded junction regions. If dopant 74 is implanted at a steep enough angle relative to axis "Y", and with a sufficient energy, the two stages will occur in the single implant step illustrated in FIG. 8. If dopant 74 is implanted at a relatively shallow angle relative to axis "Y", which would encompass an angle of 0°, and/or at a relatively low energy, then only the first stage will occur during the implant step illustrated in FIG. 8. The second stage, however, may be accomplished by subsequent thermal processing of the wafer (not shown) to diffuse dopant 74 under spacers 52.

Figure 9:
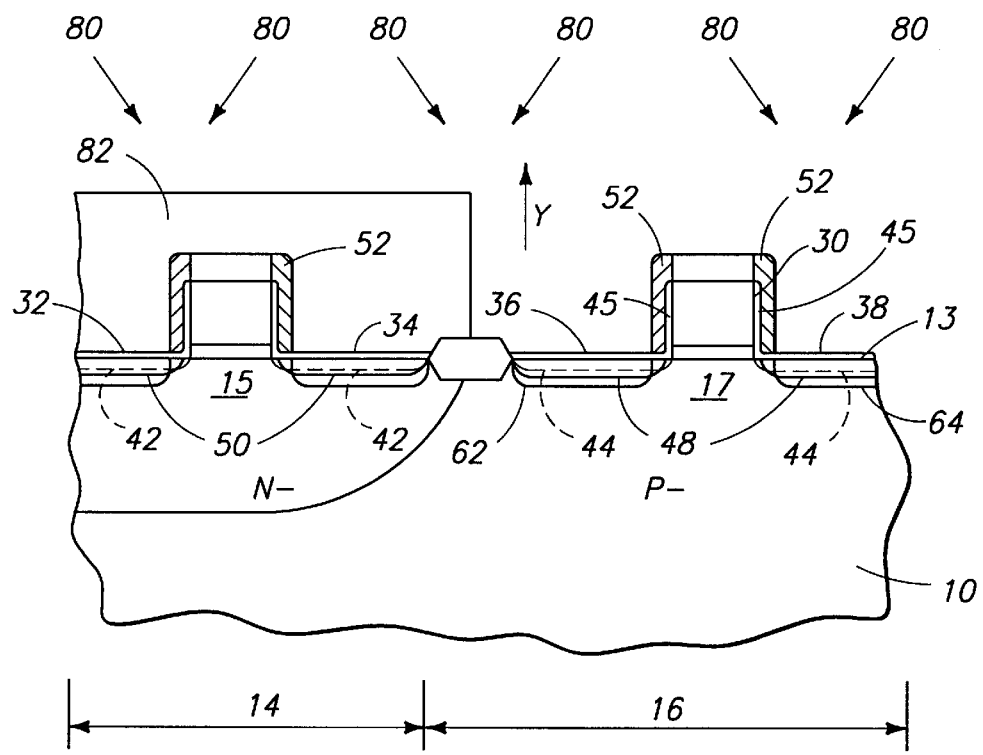
FIG. 9 is a view of the FIG. 6 wafer being processed according to an alternate embodiment of the invention.
Figure 10:
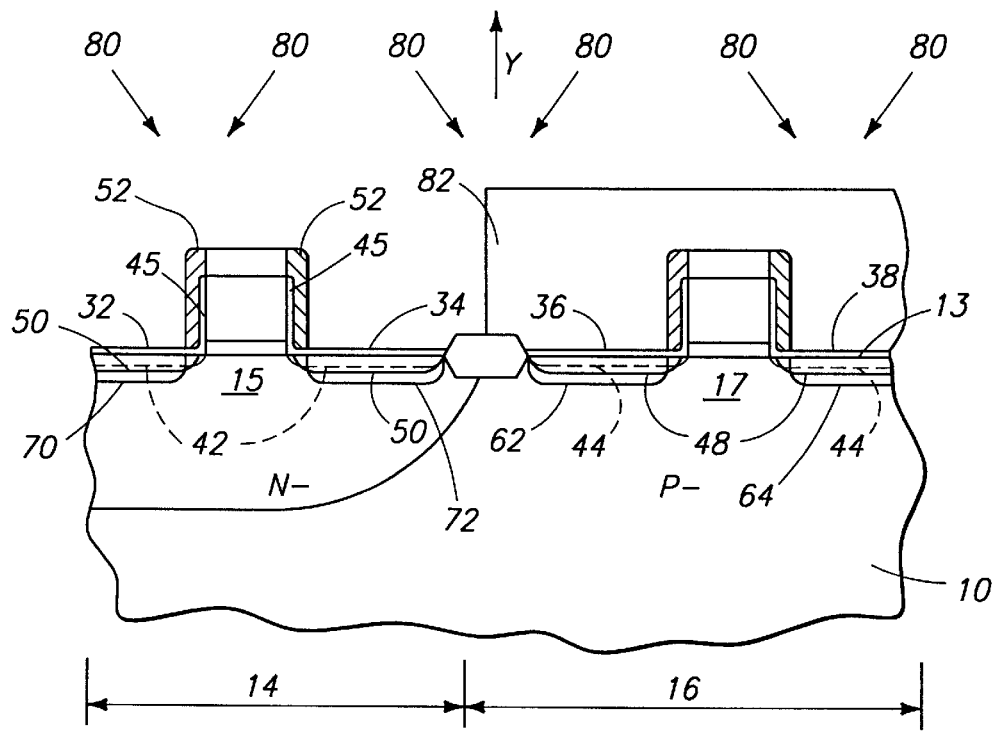
FIG. 10 is a view is a view of the FIG. 7 wafer being processed according to an alternate embodiment of the invention.

FIGS. 9 and 10 illustrate alternative embodiments of the invention in which a conductivity enhancing dopant 80 is implanted at an angle other than parallel to the axis "Y" normal to the virtual planar surface 12 of substrate 10 while one or the other of PMOS region 14 or NMOS region 16 is covered by a mask 82 (preferably of photoresist). The embodiments of FIGS. 9 and 10 can be used to provide graded junction regions in one or both of the transistors 54 and 56 or to enhance the doping of previously provided graded junction regions.

Following the formation of transistors 54 and 56, the fabrication of the CMOS circuitry can be completed by conventional processes. Such processes may include: (1) the deposition of a nitride or oxide cap over transistors 54 and 56 to block borophosphosilicate glass (BPSG) out-diffusion; (2) BPSG deposition over transistors 54 and 56; (3) the formation of contact openings to source and drain regions 62, 64, 70 and 72; and (4) the provision of conductive plugs within the formed contact openings, the plugs being in ohmic electrical contact with regions 62, 64, 70 and 72.

In compliance with the statute, the invention has been described in language more or less specific as to structural and methodical features. It is to be understood, however, that the invention is not limited to the specific features shown and described, since the means herein disclosed comprise preferred forms of putting the invention into effect.

For instance, although an n-type dopant 40 is implanted and subsequently diffused within substrate 10 prior to the implant of a p-type dopant 46 in the method shown, persons of skill in the art will recognize that the order of the implants could be reversed. Also, persons of skill in the art will recognize that the shown step of diffusion prior to the implanting of a second dopant could be eliminated. Such persons will also recognize that both the n-type dopant and p-type dopant could implanted prior to the formation of oxide layer 45 and then diffused during the subsequent formation of oxide layer 45.

The invention is, therefore, claimed in any of its forms or modifications within the proper scope of the appended claims appropriately interpreted in accordance with the doctrine of equivalents.

We claim:

1. A semiconductor processing method of forming complementary NMOS and PMOS type field effect transistors on a substrate, the method comprising the following steps:

providing a semiconductor substrate, the substrate comprising an n-type region and a p-type region;

providing a PMOS transistor gate over the n-type region, the PMOS transistor gate having sidewalls and defining a PMOS source area and a PMOS drain area operatively adjacent the PMOS transistor gate;

providing an NMOS transistor gate over the p-type region, the NMOS transistor gate having sidewalls and defining an NMOS source area and an NMOS drain area operatively adjacent the NMOS transistor gate; and after providing the PMOS and NMOS transistor gates;
  blanket implanting a p-type dopant through the PMOS and NMOS source and drain areas to form LDD regions operatively adjacent the PMOS transistor gate and to form halo regions operatively adjacent the NMOS transistor gate;

blanket implanting an n-type dopant through the PMOS and NMOS source and drain areas to form halo regions operatively adjacent the PMOS transistor gate and to form LDD regions operatively adjacent the NMOS transistor gate; and oxidizing the sidewalls of the PMOS and NMOS transistor gates after one of the blanket implantings and before the other of the blanket implantings.

2. The method of claim 1 wherein the blanket implanting the n-type dopant occurs before the blanket implanting the p-type dopant.

3. The method of claim 1 wherein the blanket implanting the p-type dopant occurs before the blanket implanting the n-type dopant.

4. The method of claim 1 wherein the substrate comprises an overall planar global configuration, the planar global configuration establishing a virtual planar top surface and an axis normal to the virtual planar top surface, the method further comprising:

after the blanket implantings, implanting an n-type dopant at an angle other than parallel to the axis normal to the virtual planar top surface of the substrate to increase a dopant concentration in the NMOS LDD regions and PMOS halo regions.

5. The method of claim 1 wherein the substrate comprises an overall planar global configuration, the planar global configuration establishing a virtual planar top surface and an axis normal to the virtual planar top surface, the method further comprising:

after the blanket implantings, implanting a p-type dopant at an angle other than parallel to the axis normal to the virtual planar top surface of the substrate to increase a dopant concentration in the NMOS halo regions and PMOS LDD regions.

* * * * *

UNITED STATES PATENT AND TRADEMARK OFFICE
CERTIFICATE OF CORRECTION

PATENT NO. : 5,849,615
DATED : December 15, 1998
INVENTOR(S) : Aftab Ahmad; Kirk Prall It is certified that error appears in the above-identified patent and that said Letters Patent is hereby corrected as shown below:

Col. 1, l. 11: Replace "(PMCS)" with --(PMOS)--.

Col. 5, l. 35: After "10 KeV" insert --to about--.

Signed and Sealed this

Twenty-fifth Day of May, 1999

Attest:

Q. TODD DICKINSON

*Attesting Officer*  *Acting Commissioner of Patents and Trademarks*